United States Patent [19]

Madjid

[11] 3,893,148

[45] July 1, 1975

[54] LAYERED SUPERLATTIC SWITCHING AND NEGATIVE RESISTANCE DEVICES

[75] Inventor: A. Hamid Madjid, State College, Pa.

[73] Assignee: The United States of America as represented by the Secretary of the Navy, Washington, D.C.

[22] Filed: Feb. 25, 1974

[21] Appl. No.: 445,374

[52] U.S. Cl. ........................ 357/16; 357/4; 357/57; 357/58; 357/88

[51] Int. Cl.² ........... H01L 29/161; H01L 29/205; H01L 29/255; H01L 27/12

[58] Field of Search ................ 357/57, 58, 88, 4, 16

[56] References Cited

UNITED STATES PATENTS

| | | | |
|---|---|---|---|
| 3,626,257 | 12/1971 | Esaki | 317/234 R |
| 3,721,583 | 3/1973 | Blakeslee | 117/215 |
| 3,737,737 | 6/1973 | Heywang | 317/234 R |

*Primary Examiner*—Martin H. Edlow
*Attorney, Agent, or Firm*—Richard S. Sciascia; Don D. Doty; Harvey A. David

[57] ABSTRACT

A solid state switching device is described that is capable of existing in a multiplicity of successive resistance states. The described device comprises layered superlattice structures generated, for example, by successive deposition of alternated layers of silicon monoxide and silver onto a substrate by evaporation.

7 Claims, 6 Drawing Figures

LAYERED SUPERLATTIC SWITCHING AND NEGATIVE RESISTANCE DEVICES

STATEMENT OF GOVERNMENT INTEREST

The invention described herein may be manufactured and used by or for the Government of the United States of America for Governmental purposes without the payment of any royalties thereon or therefor.

FIELD OF THE INVENTION

This invention relates generally to solid state switching devices, and more particularly to a multi-layered superlattice switching and negative resistance element that will switch to a succession of different resistance values upon the variation of voltage applied across the element.

DISCUSSION OF THE PRIOR ART

Multi-condition switching functions have been accomplished heretofore by a variety of devices both mechanical and solid state. Examples of mechanical devices include stepping relays, rotary switches, and the like. These are, of course, relatively slow in operation, bulky in size, and expensive to manufacture. Their use is therefore limited to applications wherein those factors are acceptable.

In the solid state realm, multiple condition switching has been carried out principally by compound devices like, for example, the flip-flop. Other solid state switching devices have relied upon semiconductor principles such as affected by magnetic, ovonic, and like phenomena.

One example of a known semiconductor switching device having a plurality of voltage and current characteristics are found in U.S. Pat. No. 3,668,480 to Chang et al. That device relies on semiconductor junctions of the Schottky barrier type formed by deep center diffusion or alloying in a semiconductor body, and appears to be limited to switching between either of two resistance states or conditions, conveniently referred to as high and low.

It would be advantageous, in the electronic arts, to have a single element solid state device that can provide more than two discontinuous resistance states or conditions and to be reversibly switchable therebetween by application of selected control voltages. The advantage thereof in computer technology application are evidently considerable for the reason that, just as binary computers are based on binary switching elements, decade computing technology may be based on a device having more than two switchable states.

Now, there has been recognized, in the solid state, semiconductor electronic device art, as well as in the more abstract studies of physical properties of materials, a structural phenomena known as a "superlattice." One example of a semiconductor device that utilizes the spatial periodic variations characteristic of superlattices is found in U.S. Pat. No. 3,626,257 to L. Esaki et al. That device exhibits a bulk negative resistance and is useful in oscillator and bistable circuits. Other known practical devices utilizing superlattices are X-ray diffraction gratings, wherein the unusual periodicity characteristics of the superlattice structures provide for diffraction coefficients different from other available gratings. As a corrolary, it is known that the existence of superlattices can be positively identified by X-ray diffraction techniques.

BRIEF SUMMARY OF THE INVENTION

The present invention or discovery aims to avoid some or many of the limitations of the prior art, through the use of synthetically generated superlattice structures in a multi-layered, solid state switching device.

With the foregoing in mind, it is a principle object of the invention to provide a novel and useful switching device that exhibits a plurality of determinable and repeatable discrete resistance, or current-voltage, characteristics, and is successively switchable therebetween by voltage variation.

Another object of the invention is the provision of a device of the foregoing character comprising a plurality of thin film layers deposited on a substrate and characterized by a superlattice extant therebetween.

Still another object of the invention is the provision of a semiconducting superlattice switching device comprising a a multiplicity of alternating layers of first and second substances, e.g., silver and silicon monoxide, which layers have cooperated to produce superlattice regions therebetween, and means for applying different voltages thereacross.

Yet another object of the present invention is the provision of a voltage controlled device of the foregoing character that is capable of reversibly switching between a succession of more than two discrete resistive conditions, whereby the device may find application as an electronic solid state counterpart to multiple condition, e.g., more than two, compound element switching systems.

Other objects and many of the attendant advantages will be readily appreciated as the subject invention becomes better understood by reference to the following detailed description, when considered in conjunction with the accompanying drawings.

DESCRIPTION OF THE PREFERRED EMBODIMENT

Figure 1:
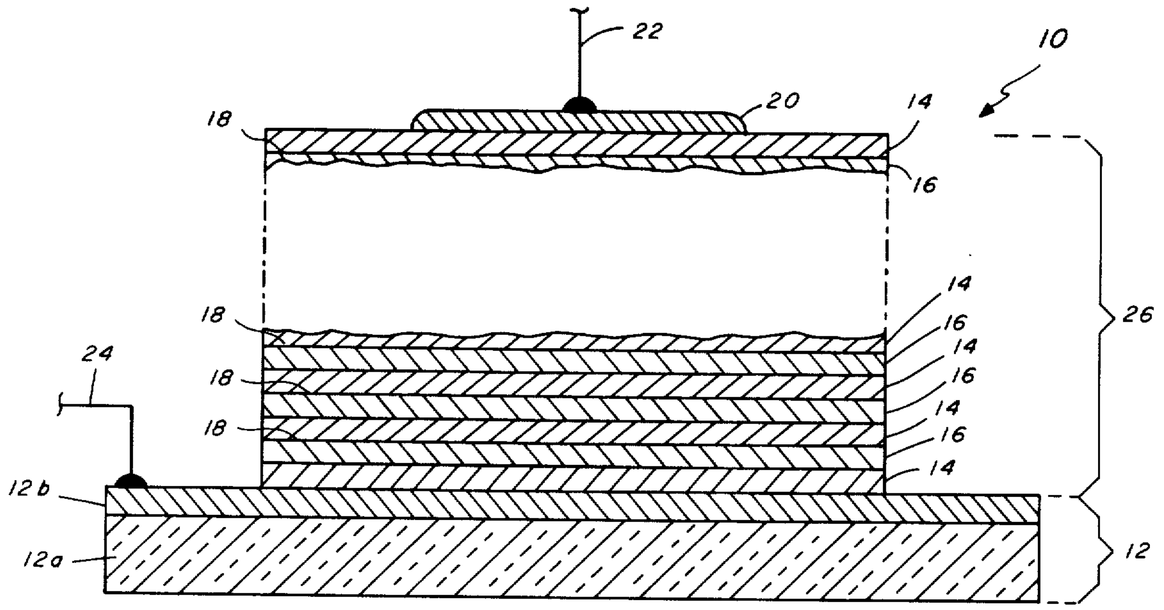
FIG. 1 is a diagrammatic sectional view of a layered superlattice structure device embodying the invention.

In the form of the invention illustrated in FIG. 1 and described hereinafter, a switching device 10 comprises a composite substrate 12 including a glass portion **12*a* and a gold conductive portion or layer 12*b*. Deposited on the gold portion 12*b* of substrate 12 are alternating layers 14 and 16 of Ag (silver) and SiO (silicon monoxide). The Ag and SiO layers are conveniently made by evaporation of those consitituents from evaporation guns, and condensation thereof on a substrate that is rotated so that the layer structure receiving side is alternatively exposed to and masked from each of the evaporation guns. As is customary, the evaporation deposition of the thin film layers is carried out in a vacuum and at elevated temperatures necessary to vaporzie the silver and silicon monoxode. The interfaces 18 formed between adjacent silver and silicon monoxide film layers 14 and 16** are characterized by what are known as superlattice regions, strucrures, or simply as superlattices.

Ohmic connections are made to device 10 by providing the ultimate silver layer 14 with a painted on layer of finely dispersed silver 20, to which a suitable wire, e.g., gold wire 22 is electrically connected, while a second wire 24 is connected, as shown, to the substrate gold conductive layer **12*b*. Applications of voltage potentials may therfore be made across the superlattice stack 26 comprised of pairs of silver and silicon monoxide layers 14 and 16,** and the superlattices therebetween.

Numerous sample devices 10 have been constructed having from 60 to 360 layer pairs, with silver film layers 14 having thicknesses ranging from about 25 A to 170 A, and silicon monoxide film layers ranging from 15 A to 173 A. Thicknesses of layers have been determined by several well known techniques including interferometry and weighing. The existence of superlattices formed by cooperation between the molecular structures of the silver and silicon monoxide layer pairs was determined through X-ray scatter techniques by which periodicities peculiar to superlattices are shown.

Figure 2:
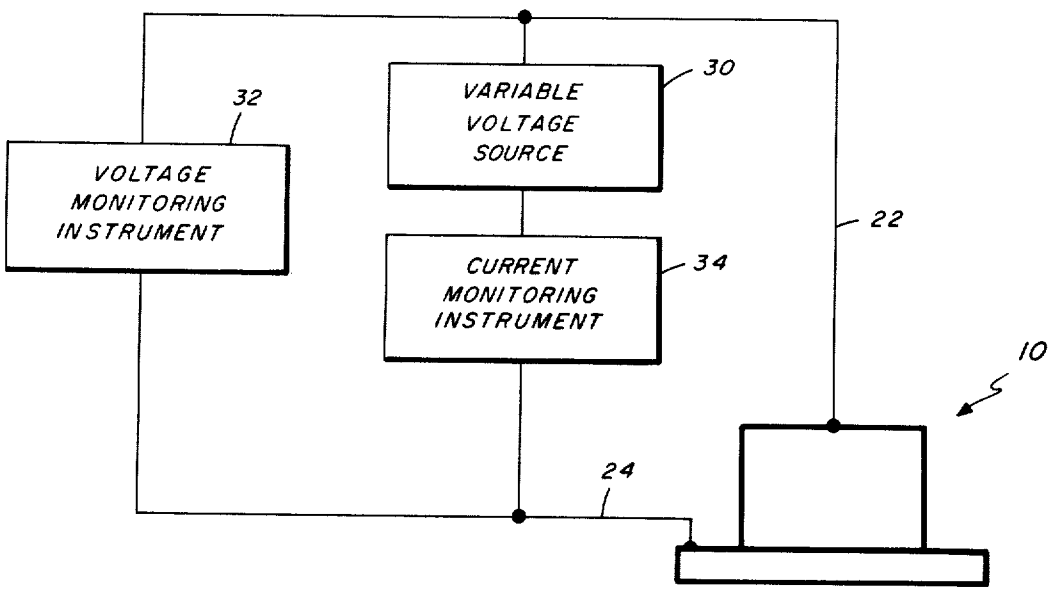
FIG. 2 is a schematic illustration, in block form, depicting operational parameter measuring circuitry.

When voltages are applied across the superlattice stack 26 via wires 22 and 24, the device 10 is capable of reversibly switching between a plurality of states of conductivity. This can readily be shown by connecting a device 10 to a suitable voltage and current monitoring instruments 32 and 34, respectively, as depicted in FIG. 2, and varying the application of voltage.

MODES OF OPERATION

The multi-state switching element will switch to a succession of different resistances values upon the variation of an applied voltage across the element. The switching is such that individual resistance values will correspond to definite voltage ranges. The useful range of the pertinent parameters on the basis of the present art are roughly:

Voltage: 0 - 40 volt

Current: 0 - 100 ma

Resistance: $10^3$ - $10^6$ Ω. Switching elements may be made to work in the following switching modes:

A. Fast, Reversible Switching

When scanning the applied voltage, the device 10 will switch almost instantaneously (faster than 50 μsec), and reversibly into and from the different resistance states. This operation may be used to perform functions previously accomplished by rotary or stepping switches in combination with numerous fixed resistors.

Typical example:

from 0 to 6 volts — 6200 Ω;

from 6 to 14 volts — 12500 Ω;

from 14 to 18 volts — 25000 Ω;

from 18 to 25 volts — 50000 Ω; etc.

B. Delayed, Fast, Reversible Switching (Delay)

Device 10 will switch almost instantaneously (faster than 50 μsec), and reversibly, from a "ground" resistance state into an "excited" resistance state. It will persist in the "excited" state not only as long as the voltage is maintained above switching threshold, but it will remain in this "excited" state even after the voltage is decreased below the switching threshold for periods of seconds to minutes (depending on the inherent time constant of the selected device).

Typical example:

from 0–5 volts - 5000 Ω;

from 5–25 volts — 100,000 Ω;

delay time at zero voltage to switch from "excited" 100,000 Ω state to the "ground" 5000 Ω state, about 1 minute.

C. Slow, Irreversible Switching

Devices 10 embodying the invention may be selected to perform functions previously accomplished by rheostats. Thus, it is a characteristic of selected devices 10 that the "ground" resistance state is non-linear (non-linear I-V characteristic), resulting in a gradual, (reversible), decrease in resistance up to some threshold voltage value. Above this threshold, and if the device is held at a constant voltage, resistance decreases spontaneously to a definite equilibrium value. This process may take a fraction to many minutes. Decreasing the voltage at any time, therefore, will cause the return I-V characteristic to be steeper than the ascending characteristic and the element thus changes slowly and continuously to lower resistance values up to some limiting equilibrium resistance value.

Theoretical Considerations

The superlattice character of the devices rests in the fact that such layer structures are characterized by three repetitive arrays: by the $n_{SiO}$ and $n_{Ag}$ atoms in each silicon monoxide layer, in each silver layer, and by the identity period II, $$II = [n_{SiO} + n_{Ag}]. \quad (1)$$

Account must be taken of the fact that the $n_{Ag}$ and $n_{SiO}$ layers will, of course, not fit perfectly on top of each other. The successive layers will merge through matching boundary layers in which considerable intermixing and disorder may occur. There also exists evidence that SiO, although stable in the vapor phase, tends to anneal into a conglomerate of Si and $SiO_2$. The microscopic characterization of the layer structures is, therefore, complicated. But in spite of the structural complexity, the salient fact remains inviolate that the structures are repetitive arrays of similar units. Fulfillment of this feature is all that is necessary for making the classification of these structures as superlattices legitimate and the only modification in the idealized expression (1)that is necessary, in order to be more realistic, is to write, $$II = [n_{Ag} + \delta_{Ag \rightarrow (SiO)=} + n_{(SiO)=} + \delta_{(SiO)= \rightarrow Ag}] \quad (2)$$

where the δ's stand for the interfacial layers and with (SiO)* signifying the appropriate equilibrium, $$2\,SiO \rightleftarrows Si + SiO_2. \quad (3)$$

The identity period II was empirically determined. To begin with, each evaporation gun was repeatedly calibrated as to evaporation rate versus temperature by employing weighing techniques. But, more accurately, II was determined using a multiple beam interferometry method for measuring the total thickness of the deposited superlattice and dividing by the number of layers deposited. The individual layer thicknesses were measured by blanking the SiO, but not the Ag beam at one side thus depositing only silver at that side of the substrate. Both the thickness of the individual Ag layers, as well as II could, thus, be directly measured by the procedure described and the thickness of the (SiO)* layers could, thus be arrived at by subtraction.

To test the accuracy of the above measurements and to prove that the structures produced would indeed react toward an incident wave field as a periodic structure of identity period II, monochromatic X-rays were diffracted from the samples using copper K radiation within a small angle Siemens Kratky camera. The identity periods calculated from Bragg's relation compared with those determined by interferometry agreed within about 10%, and the periodic nature of the structures as well as the value of the identity period may, thus, be considered as having been experimentally established.

Layer structures which were examined, and which were found to exhibit switching characteristics had identity periods from about 25 to 170 A. The individual layer thicknesses ranged from 20 to 90 A for the (SiO)* layers and from 3 to 85 A for the Ag layers. The total number of deposited layer pairs in the samples varied from 60 to 360. Virtually all samples tested exhibited a low field conductivity characteristic of the form, $$\sigma = \sigma_0 e^{\frac{\Delta\epsilon^*}{2kT}} \qquad (4)$$

for applied potentials up to about 30 mV. $\sigma$ is here the conductivity; $\sigma_0$ a constant pre-exponential term; and $\Delta\epsilon^*$ the effective activation energy. The application of excessive potentials tended to alter the characteristic irreversibly.

Both $\Delta\epsilon^*$ and $\sigma_0$ depended on the identity period II, and this dependency was identified within the interval $30 \leq$ II $\leq 400$ A tentatively as, $$\Delta\epsilon^*(\mathrm{II}) = 1.5\ [1 - \exp(-2.9 \times 10^{-3}\ \mathrm{II})]\ \mathrm{eV} \qquad (5)$$

$$\sigma_0(\mathrm{II}) = 1.2 \times 10^{-10} \exp(2.9 \times 10^{-2}\ \mathrm{II})\ (\mathrm{Ohm\ cm})^{-1} \qquad (6)$$

with II given in A.

For applied potentials above 30 mV and below about 1 volt the current through the samples depended on the voltage V as, $$I = \mathrm{const.}\ V^m \qquad (7)$$

$$(m=1) = \frac{68}{\pi} \qquad (8)$$

with II again given in A.

Figure 3:
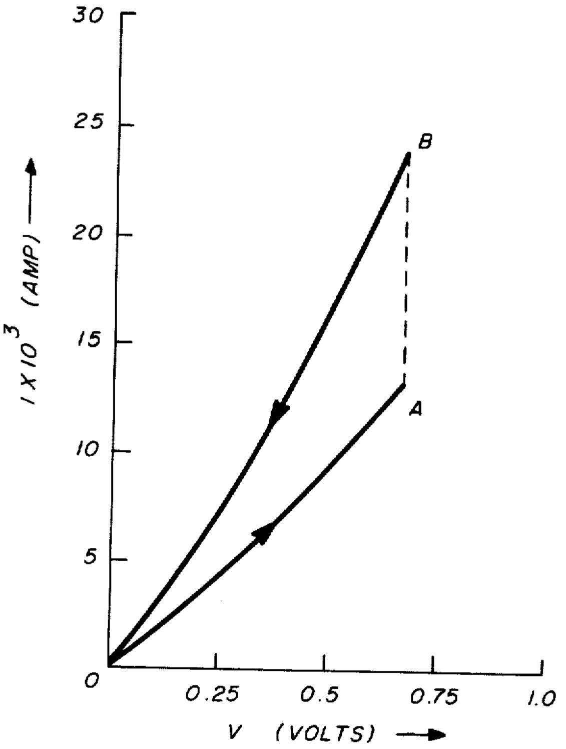
FIG. 3 is a graphic illustration of I-V (current-voltage) characteristics of a superlattice layer structure showing a voltage induced transition between alternative I-V modes.

Above 1 volt generally, but sometimes below this voltage, switching phenomena would occur in many, but not all the samples. Both reversible and irreversible switching events were observed. After irreversible switching, the sample could not be returned to its initial low field conductivity state. Reversible switching occurred either slowly or rapidly. A typical slow mode switching characteristic is shown in FIG. 3. Raising the potential across the same rapidly, yielded the trace OA on the characteristic. Stopping the voltage sweep at point A caused a time dependent increase of the current to its ultimate value at B. This increase could be expressed as, $$R(t) - R_B(\infty) = [R_A(O) - R_B(\infty)] \exp(-t/\lambda \qquad (9)$$

with $t$ the time, $\lambda$ the time constant, and the R's defined by the respective (V/I)'s. Path AO was retraced if the voltage was swept downward immediately, ($t << \lambda$). But BO was the trace if the voltage decrease was started only when equilibrium was established after several $\lambda$'s. A similar situation developed when O was reached along BO. Recycling immediately would give OB but the equilibrium trace would be OA. Any desired trace between the two extremes could be chosen, at will, by varying the "resting time" at A along OA or at O along BO. The time constants for different samples ranged from a fraction, to many minutes. $\lambda$ for the characteristic shown in FIG. 3 was 1 minute.

In other samples, generally at higher voltages, the transition from A to B occurred rapidly, ($\lambda < 50\ \mu$sec ). Such samples did not have intermediate traces, but would recycle along either OB or OA depending on whether the "rest time" at 0 did, or did not exceed some definite value.

Figure 4:
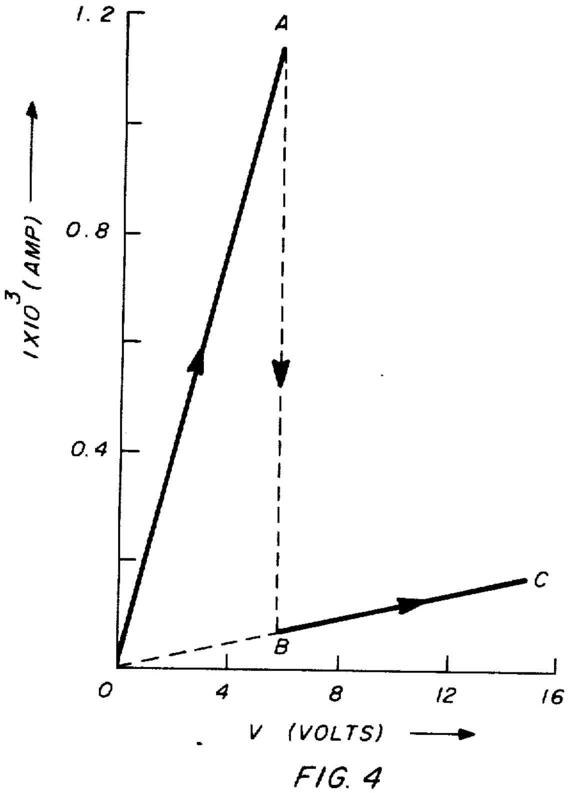
FIG. 4 is a graphic illustration of a switching characteristic of a sample between two resistance values.
Figure 5:
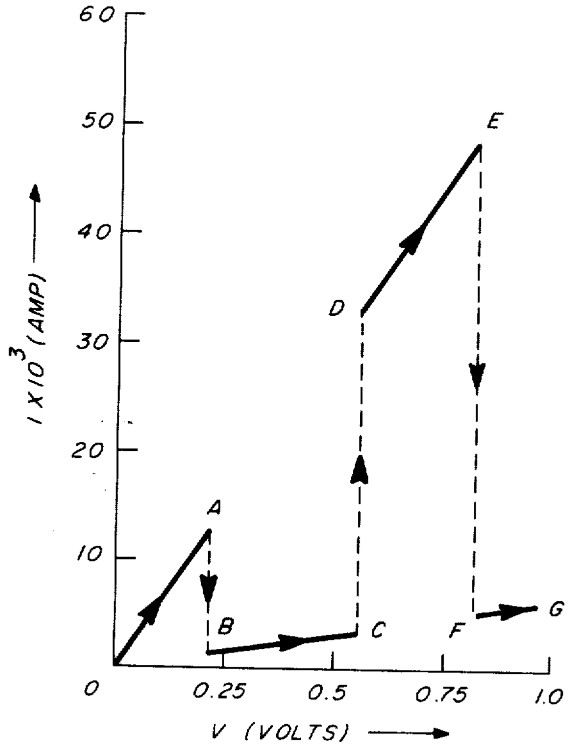
FIG. 5 is a graphic illustration of sequential superlattice switching between two resistance states.
Figure 6:
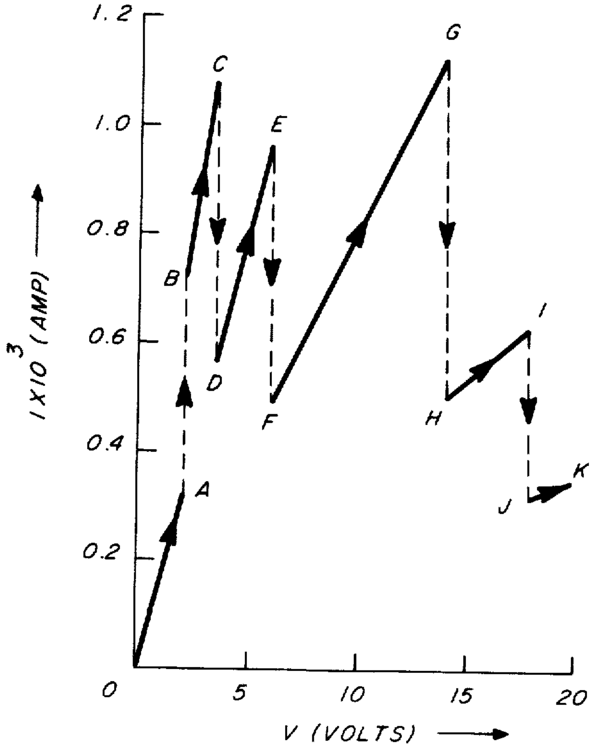
FIG. 6 is a graphic illustration of sequential superlattice switching between multiple resistance states.

Some layer structures would switch to higher resistance values as shown in FIG. 4. Others would combine the two last mentioned modes into a sequential pattern as shown in FIG. 5. But the most peculiar and, at once, the potentially most useful switching effect observed is the multi-state pattern shown in FIG. 6. The layer structure acts here as a multi-throw switch.

Superlattices may, with advantage, be considered as a distinct form of the condensed state. An equivalent, but separate accumulation of Ag and SiO bulk, will certainly not act in the manner described. The two components must be combined in a layer structure in order to yield the observed results. Layer structures are supercrystals in which a layer pair takes the place of the crystalline basis. If there happens to be an appreciable overlap of the Ag states with the conduction band states of the SiO across the boundaries, then running wave solutions could exist which will extend across the entire layer structure, and which may give rise to charge carrier itinerancy. The minizone dispersion E(k), will, in part, be given by the identity period II. Thus, Eq. (4) probably represents the activation of charge carriers from nonconducting to itinerant states. That the minizone scheme depends on II is reflected by Eq. (5). The exponential dependence of $\sigma_0$ (II) on II may arise from the fact that samples with larger II will have a smaller fraction of their bulk occupied by disordered boundary layers and that scattering, as a consequence, becomes less serious as II increases. The I-V characteristics at intermediate applied potentials show that space charge effects play an important role in the charge carrier transport. This is to be expected because layer structures are in essence a microscopic version of a Maxwell-Wagner capacitor. Because of this it is likely that space charges will predominantly accumulate in the interfacial layers. This means that a voltage dependent barrier sequence will appear in the structure at each interface which will have periodicity ½ II. Thus it is reasonable to expect that transport may have a pronounced effect on the mini band structure of the structure and this may be the explanation of some of the switching phenomena. Equation (9) is reminescent of the time dependence of the charge accumulation in a Maxwell-Wagner capacitor and the slowly occurring transition from A to B in the slow switching characteristic of FIG. 4 may well arise from band structure changes which are locked in step with the interfacial charge accumulation. The peculier switching effects observed at still higher applied potentials may be due to a Wannier-Stark ladder splitting and the tunnelling of electrons from ground states in one identity cell to excited states in the neighboring cell. Irreversible switching, finally, may be attributed to local heating and a consequent short circuiting of the insulating layers by silver bridges. This contention is supported by the fact that $\Delta\epsilon^*$ decreases radically after a sample switches irreversibly. Such a collapse of $\Delta\epsilon^*$ was never observed in the reversible case even after several hundred switching cycles.

Obviously, other embodiments and modifications of the subject invention will readily come to the mind of one skilled in the art having the benefit of the teachings presented in the foregoing description and the drawings. It is, therefore, to be understood that this invention is not to be limited thereto and that said modifications and embodiments are intended to be included within the scope of the appended claims.

What is claimed is:

1. A solid state, multiple resistance switching device comprising:

substrate means, including a first conductive layer, for supporting thin film layers and for providing electrical connection with a first one of said thin film layers;

a plurality of superimposed thin film layers supported on said substrate means and comprising alternate silicon monoxide and silver thin film layers, adjacent ones of said silicon monoxide and of said silver thin film layers forming layer pairs;

said silicon monoxide thin film layers each being in the range of 20 A to 90 A in thickness and said silver thin film layers each being in the range of 3 A to 85 A in thickness;

a superlattice structure being disposed between the layers of each of said pairs, each superlattice structure having an identity period that is different from the characteristic identityperiods of boundary structures of either of the layers of the respective layer pair;

a second conductive layer providing electrical connection with another of said thin film layers; and said device being characterized by an ability to change between more than two discrete resistance values in response to changing voltages applied across said thin film layers and said superlattice structures.

2. A solid state, multiple resistance switching device as defined in claim 1, and wherein:

said layer pairs are in the range of 60 to 360 in number.

3. A solid state, multiple resistance switching device as defined in claim 2, and wherein:

said superlattice structures have identity periods in the range of 25 A to 170 A.

4. A solid state, multiple resistance switching device as defined in claim 3, and wherein:

said substrate means comprises a supportive layer of glass, and said first conductive layer comprises gold.

5. A solid state, multiple resistance switching device as defined in claim 3, and wherein:

said second conductive layer comprises a layer of silver, applied as a dispersion of silver in a vehicle.

6. A solid state, multiple resistance switching device as defined in claim 3, and:

said device being further characterized by being reversible in its ability to change between said discrete resistance values in response to changing voltages.

7. A solid state, multiple resistance switching device as defined in claim 6, and wherein:

said substrate means comprises a supportive layer of substantially non-conductive material; and said first conductive layer comprises a metal film.

* * * * *